United States Patent
Khan et al.

(10) Patent No.: US 6,979,615 B2
(45) Date of Patent: Dec. 27, 2005

(54) SYSTEM AND METHOD FOR FORMING A SEMICONDUCTOR WITH AN ANALOG CAPACITOR USING FEWER STRUCTURE STEPS

(75) Inventors: Imran M. Khan, Richardson, TX (US); Louis N. Hutter, Plano, TX (US); James Todd, Plano, TX (US); Jozef C. Mitros, Richardson, TX (US); William E. Nehrer, Soquel, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/243,405

(22) Filed: Sep. 12, 2002

(65) Prior Publication Data

US 2004/0053455 A1 Mar. 18, 2004

(51) Int. Cl.[7] .................. H01L 21/336; H01L 21/8242; H01L 21/8234
(52) U.S. Cl. .................... 438/257; 438/243; 438/238
(58) Field of Search .................. 438/197, 201, 438/210, 211, 238, 239, 243, 257

(56) References Cited

U.S. PATENT DOCUMENTS 6,495,419 B1 * 12/2002 Ahmed et al. ............ 438/258

OTHER PUBLICATIONS

Wolf, S. "Silicon Processing for the VLSI Era", vol. 2–Process Integration, 1990, section 4.4.1.2, pp. 201–204 and section 4.5.4.2, pp. 247–251.*

* cited by examiner

Primary Examiner—Michael S. Lebentritt
Assistant Examiner—Scott B. Geyer
(74) Attorney, Agent, or Firm—Jacqueline J. Garner; W. James Brady, III; Frederick J. Telecky, Jr.

(57) ABSTRACT

A method for manufacturing a semiconductor device that comprises forming an oxide layer over a substrate. A polysilicon layer is disposed outwardly from the oxide layer, wherein the polysilicon layer forms a floating gate. A PSG layer is disposed outwardly from the polysilicon layer and planarized. The device is pattern etched to form a capacitor channel, wherein the capacitor channel is disposed substantially above the floating gate formed from the polysilicon layer. A dielectric layer is formed in the capacitor channel disposed outwardly from the polysilicon layer. A tungsten plug operable to substantially fill the capacitor channel is formed.

10 Claims, 5 Drawing Sheets

US 6,979,615 B2

SYSTEM AND METHOD FOR FORMING A SEMICONDUCTOR WITH AN ANALOG CAPACITOR USING FEWER STRUCTURE STEPS

TECHNICAL FIELD OF THE INVENTION

This invention relates generally to techniques for fabricating semiconductor devices and, more specifically, to reducing the number of structure steps.

BACKGROUND OF THE INVENTION

Non-volatile memory is used to store data in a device where the data has to be maintained even when the device is not connected to a power supply. For example, non-volatile memory may be used in personal computers to store instructions for completing basic tasks, such as a BIOS interfacing with a keyboard or accessing a disk drive. A common type of non-volatile memory is an EEPROM (electrically erasable programmable read-only memory). Unlike some other types of non-volatile memory devices, data in EEPROM devices can be erased and rewritten.

Traditionally, there has been two types of electrically programmable/erasable cells available. First, poly/poly stack structures are used in flash memory. The cell size is ~3 $\mu m^2$ and is typically used in high density array applications. However, a flash device adds significant cost and complexity to the memory manufacturing process. For instance, many flash processes require six or more additional masks to the baseline. A second approach is to use a single level EEPROM. However, the cell size in this case is ~200 $\mu m^2$. This limits its usage to applications requiring only few to couple of hundreds of bits.

SUMMARY OF THE INVENTION

One aspect of the invention is a method for manufacturing a semiconductor device that comprises forming an oxide layer disposed outwardly from a substrate. A polysilicon layer is disposed outwardly from the oxide layer, wherein the polysilicon layer forms a floating gate. A PSG layer is disposed outwardly from the polysilicon layer and planarized. The device is pattern etched to form a capacitor channel, wherein the capacitor channel is disposed substantially above the floating gate formed from the polysilicon layer. A dielectric layer is formed in the capacitor channel disposed outwardly from the polysilicon layer. A tungsten plug operable to substantially fill the capacitor channel is formed.

The invention has several important technical advantages. Various embodiments of the invention may have none, some or all of these advantages. One advantage may be that the manufacturing process is simpler and requires fewer structure steps. The simpler process may be used in analog capacitor fabrication. The semiconductor may also be a memory device with reduced cell size for memory arrays with higher density than existing single poly non-flash devices. Further, the present invention can easily be integrated into the current process flow with minimal changes. Other technical advantages of the present invention will be readily apparent to one skilled in the art.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF EXAMPLE EMBODIMENTS OF THE INVENTION

Figure 1:
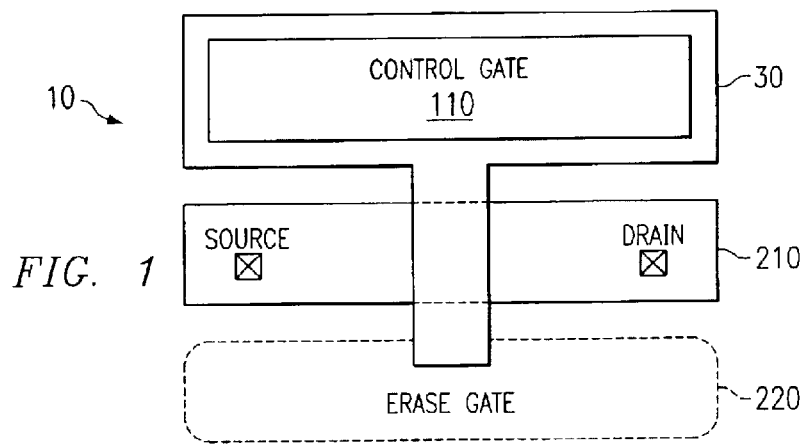
FIG. 1 is an overhead view illustrating a portion of an embodiment of a semiconductor device constructed in accordance with the present invention.

FIG. 1 is an overhead view illustrating a semiconductor device 10 manufactured in accordance with the present invention. Particular examples and dimensions specified throughout this document are intended for exemplary purposes only and are not intended to limit the scope of the invention. Other embodiments of semiconductor device 10 may be formed without departing from the scope of this disclosure. In general, the present invention provides a more efficient process for fabricating a more reliable semiconductor device 10.

In one embodiment, semiconductor device 10 is a memory device, such as an EEPROM memory device, that includes polysilicon layer 30 operable to form a floating gate, tungsten plug 110 operable to form a control gate, and sense transistor 210. Further illustrated in FIG. 1 is an erase gate 220, which may be eliminated by the techniques associated with the present invention. It will be understood that while erase gate 220 may be eliminated, it may be present without departing from the scope of this disclosure.

If memory device 10 includes erase gate 220, then it is programmed when the erase gate 220 is grounded and a positive voltage of fourteen to twenty-four volts is applied to the tungsten plug 110. As a result, the polysilicon layer 30 will be charged negatively. To erase memory device 10, the tungsten plug 110 is grounded and a positive voltage of twelve to twenty volts is applied to the erase gate 220. The electrons flow away from the floating gate and the floating gate is neutral or charged positively. By forming memory device 10 such that the control gate may be used to both program and erase the EEPROM, the present invention eliminates the need for erase gate 220. In this regard, semiconductor device 10 may reduce its cell size by 90%.

In one aspect of operation, the presence or absence of charge on the floating gate associated with device 10 determines the threshold voltage of the device and drain read current Idread, which flows through the device when specific drain Vd and control gate Ccg voltages are applied. For example, a positive voltage of fourteen to twenty-four volts is applied to the tungsten plug 110 to program semiconductor device 10 operating in a first mode. This causes the attraction of charge to polysilicon layer 30 as the electrons flow through gate oxide 24 and will charge the floating gate, increasing the threshold voltage of the semiconductor device 10 to or above 5V. As a result, the drain read current Idread(Vds=1V,Vcg=5V) is negligible, i.e., at single microamperes level or below it. The floating gate has negative charge in such a programmed state. Due to the substantial isolation of the tungsten plug 110, this device does not require the erase gate 220. To erase the semiconductor device 10 operating in a second mode, negative fourteen to twenty-four volts is applied to the tungsten plug 110. The negative voltage causes the electrons to flow away from the floating gate to the substrate. This makes the floating gate neutral or charged by positive charge. The threshold voltage of erased device is equal that of UV erased device or is below it. The drain read current Idread(Vds=1V,Vcg=5V) is well above ten microamperes.

Figure 2:
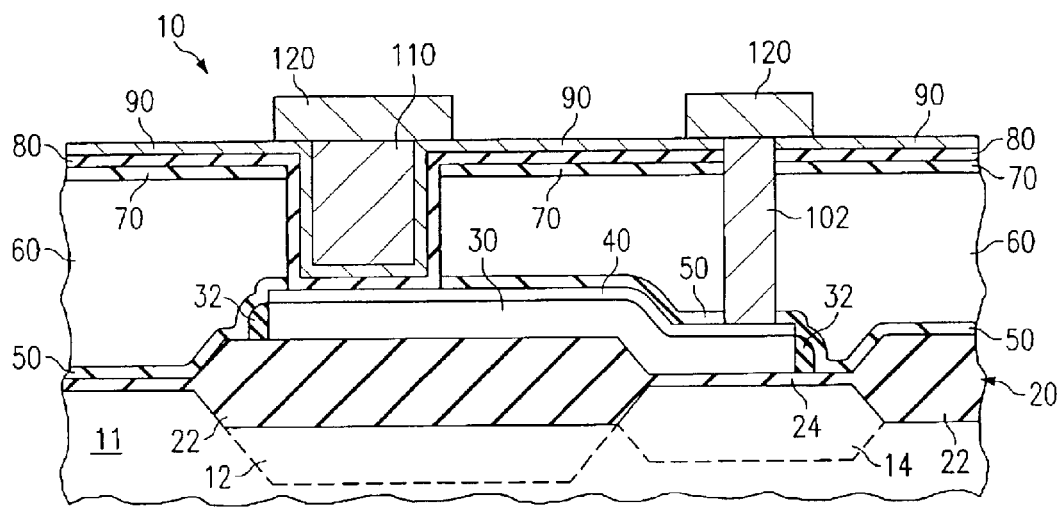
FIG. 2 is a cross-sectional view illustrating the semiconductor device of FIG. 1.

FIG. 2 illustrates a cross-sectional view of one embodiment of semiconductor device 10. Semiconductor device 10 may comprise an EEPROM (electrically erasable programmable read-only memory), a capacitor, or any other appropriate semiconductor device.

In one embodiment, semiconductor device 10 includes substrate 11, oxide layer 20, polysilicon layer 30, silicide layer 40, first TEOS (tetraethylorthosilicate) layer 50, PSG (phosphorus silicate glass) layer 60, second TEOS layer 70, dielectric layer 80, titanium-nitride layer 90, tungsten plugs 110 operable to form a control gate, and metallized layer 120. Semiconductor device 10 may also include a Pwell region 14 and may include a Nwell region 12 in substrate 11 beneath the control gate. One purpose of Nwell region 12 is to reduce capacitance of the floating gate to Pwell and p-substrate to increase the coupling ratio between the control gate and the floating gate. It will be understood that while semiconductor device 10 is described in terms of an n-channel device, a p-channel device may be formed without departing from the scope of the invention. Further, semiconductor device 10 may include sense transistor 210 (shown in FIG. 1) that includes a source region, a drain region, and a channel region.

Substrate 11 may be a wafer formed from a single crystalline silicon material. Substrate 11 may also comprise other materials. For example, substrate 11 may comprise an epitaxial material, a polycrystalline semiconductor material, or any other suitable material. Substrate 11 may also comprise multiple layers of semiconductor material without departing from the scope of the invention. The substrate 11 is doped with sufficient p-type ions, such as boron, to form Pwell region 14. A combination of arsenic and phosphorous ions may be implanted into the substrate 11 to form Nwell region 12.

Oxide layer 20 is formed adjacent to substrate 11 by any of a variety of techniques known to those skilled in the art. It will be understood that oxide layer 20 may include a field oxide region 22 and gate oxide region 24. In one embodiment, gate oxide layer 24 is formed from a single oxide material and is approximately seventy-five to one hundred twenty Angstroms thick. The field oxide layer 22 may be formed by thermal oxidation of silicon to the final field oxide thickness five to seven thousand Angstroms. While desirable results may be obtained with this thickness range, the invention is not limited to any particular thickness unless expressly included in the claims. Other embodiments of the present invention may exclude oxide layer 20, comprise other materials, or include a plurality of layers comprising or in place of oxide layer 20 without departing from the scope of the present invention.

Polysilicon layer 30 is disposed outwardly from oxide layer 20 and may be formed from a polycrystalline silicon material (polysilicon) that is doped by implantation, doped by POCl3 in a furnace, or in-situ doped with impurities to render the polysilicon conductive. Polysilicon layer 30 may form a floating gate that is capacitively coupled with the tungsten plug 110—being well isolated from it by an insulating—or dielectric—layer 80. It will be understood that while FIG. 2 illustrates polysilicon layer 30 extending over gate oxide 24, in some embodiments polysilicon layer 30 may significantly reside over the field oxide 22. For example, in one embodiment semiconductor device may comprise an EEPROM device and the polysilicon layer 30 extends over gate oxide 24. For example, in one embodiment semiconductor device may comprise an EEPROM device and the polysilicon layer 30 extends over gate oxide 24. However, in a second embodiment, semiconductor device may comprise an analog capacitor and the polysilicon layer 30 may not extend over gate oxide 24.

In one embodiment, semiconductor device 10 may include silicide layer 40. Silicide layer 40 may be formed from any one of a variety of silicon-based materials, such as cobalt silicide (CoSi2), platinum silicide (PtSi2), and titanium silicide (TiSi2). First TEOS layer 50 is disposed outwardly from silicide layer 40 by any variety of techniques known to those skilled in the art. First TEOS layer 50 may be any material, including USG (undoped silicate glass), that substantially reduces phosphorous leakage into substrate 11.

PSG layer 60 is disposed outwardly from first TEOS layer 50 by any of a variety of techniques known to those skilled in the art. PSG layer 60 may be formed from any one of a variety of materials, including PSG, BPSG (boron phosphorus silicate glass), PTEOS (phosphorous doped tetraethylorthosilicate), or BPTEOS (boron and phosphorous doped tetraethylorthosilicate). In one embodiment, PSG layer 60 creates a substantially flat topography for layers disposed outwardly from it. Furthermore, PSG layer 60 may act as a barrier layer to mobile ion contamination of sodium or metallic alloys from reaching the lower layers.

Second TEOS layer 70 is disposed outwardly from PSG layer 60. Second TEOS layer 70 may be used for capping so that phosphorus from PSG layer 60 does not diffuse into outer layers. It will be understood that second TEOS layer 70 may comprise any material operable to prevent phosphorus from getting between the outer layers where it may cause reliability problems, including intermetal leakage in some embodiments.

Memory device 10 includes a dielectric layer 80. Dielectric layer 80 may be formed from any one of a variety of insulating materials, including TEOS, oxide, or oxide-nitride-oxide (ONO). The dielectric layer 80 may comprise other materials or may comprise a plurality of layers without departing from the scope of the present invention. Dielectric layer 80 is approximately five hundred Angstroms thick. While desirable results may be obtained with this thickness range, the invention is not limited to any particular thickness unless expressly included in the claims. In one embodiment, semiconductor device 10 may include a titanium-nitride layer 90 layer. Titanium-nitride layer 90 may substantially protect dielectric layer 80 from the tungsten plug 110. It will be understood that titanium-nitride is for example purposes only and that any material operable to reduce contamination of the dielectric layer 80, if any, may be used.

Memory device 10 includes one or more tungsten plugs 110. One tungsten plug 110 forms a control gate that is substantially isolated from other components and the silicon substrate 11. As a result, the control gate is operable to receive positive and negative voltage and the memory device 10 may be programmed and erased by applying these voltages to the control gate. In one embodiment, the capacitance of the control gate may not significantly change as a function of voltage. As will be understood by those skilled in the art, the control gate, made of one tungsten plug 110, is capacitively coupled with the polysilicon layer 30—being well isolated from it by an insulating—or dielectric—layer 80. It will be further understood by those skilled in the art that the same polysilicon layer 30, dielectric layer 80, and tungsten plug 110 could be used to build an analog capacitor in the same integrated circuit that significantly reduces its manufacturing cost. The remaining tungsten plugs, if any, form a contact for memory device 10.

The metallized layer 120 may be formed from any of a variety of metals or metal alloys, such as copper (Cu), aluminum (Al), tungsten (W), titanium tungsten (TiW), and titanium nitride (TiN). The metallized layer 120 may comprise other materials or may comprise a plurality of layers without departing from the scope of the present invention. In one embodiment, metallized layer 120 may include a titanium layer, an aluminum-copper layer disposed outwardly from the titanium layer, and a second titanium-nitride layer disposed outwardly from the aluminum-copper layer. In another embodiment, metallized layer 120 may include a titanium layer, a second titanium-nitride layer disposed outwardly from the titanium layer, an aluminum-copper layer disposed outwardly from the second titanium-nitride layer, and a third titanium-nitride layer disposed outwardly from the aluminum-copper layer. Metallized layer 120 is approximately six thousand to eight thousand Angstroms thick. While desirable results may be obtained with this thickness range, the invention is not limited to any particular thickness unless expressly included in the claims.

Figure 3A:
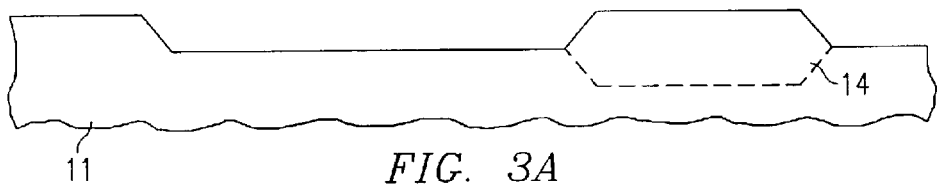
FIGS. 3A–O are cross-sectional views illustrating an example method of forming the semiconductor device of FIG. 1.
Figure 3B:
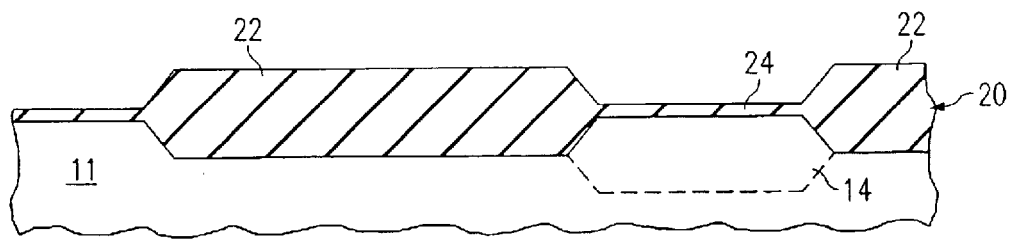
Figure 3C:
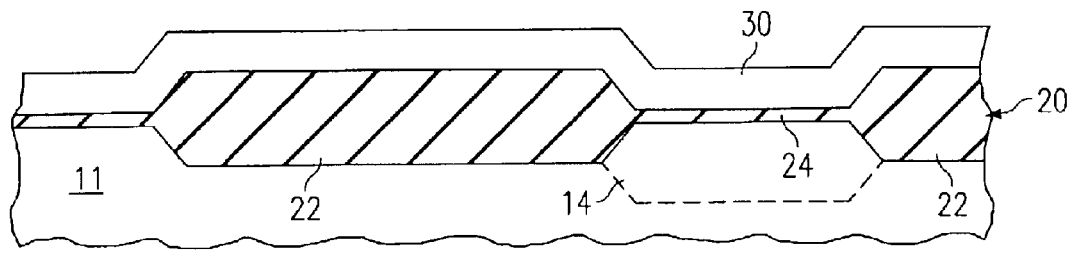
Figure 3D:
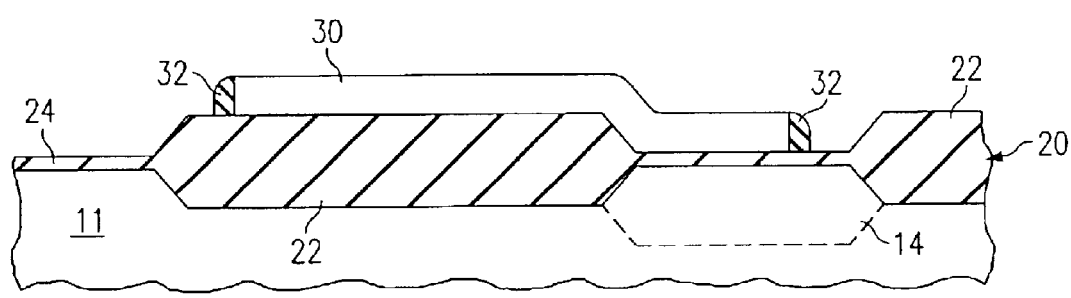
Figure 3E:
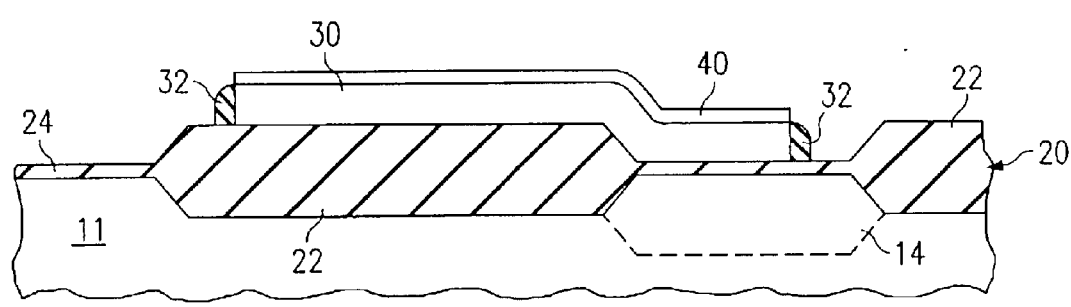
Figure 3F:
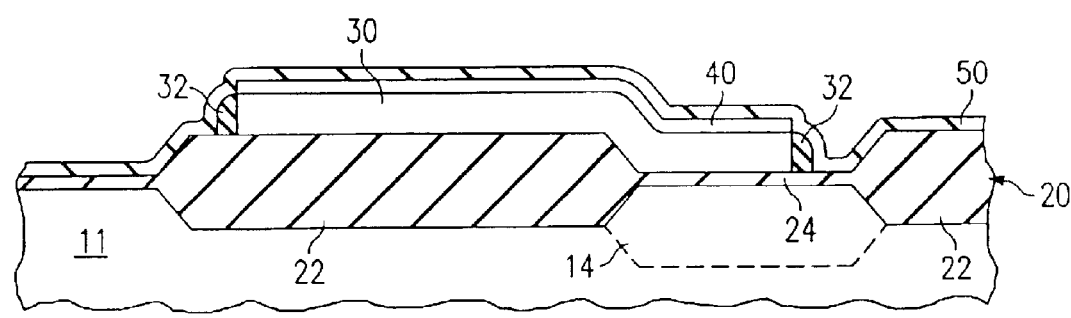
Figure 3G:
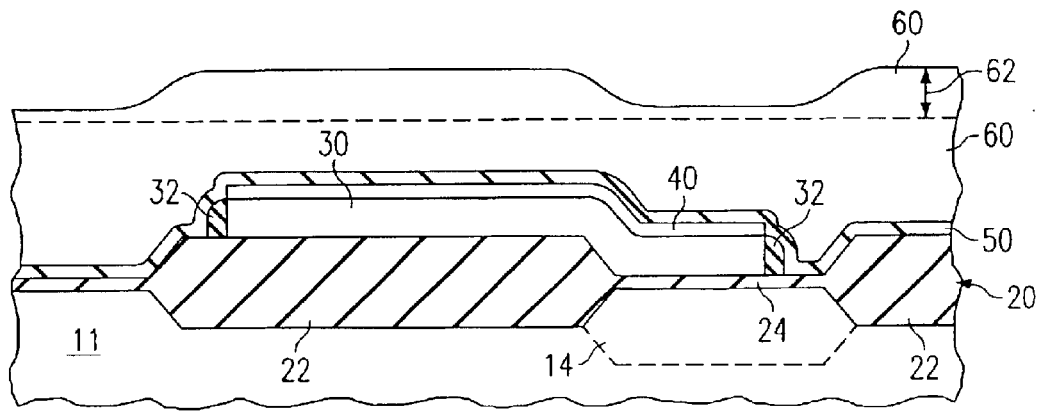
Figure 3H:
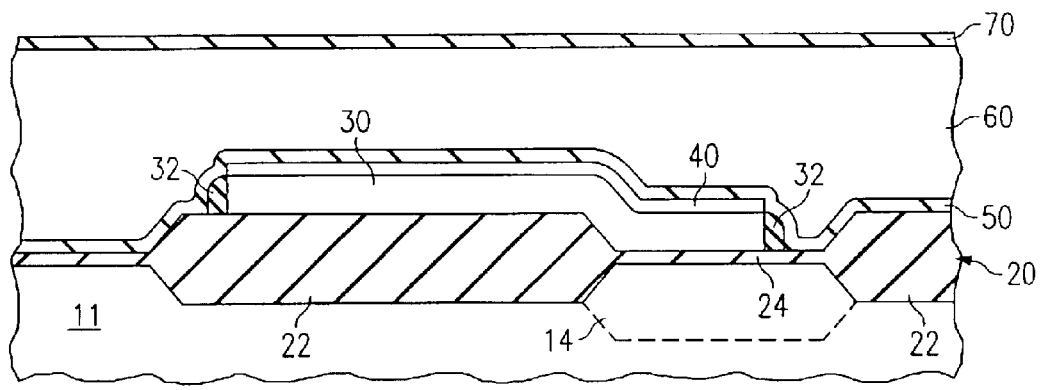
Figure 3I:
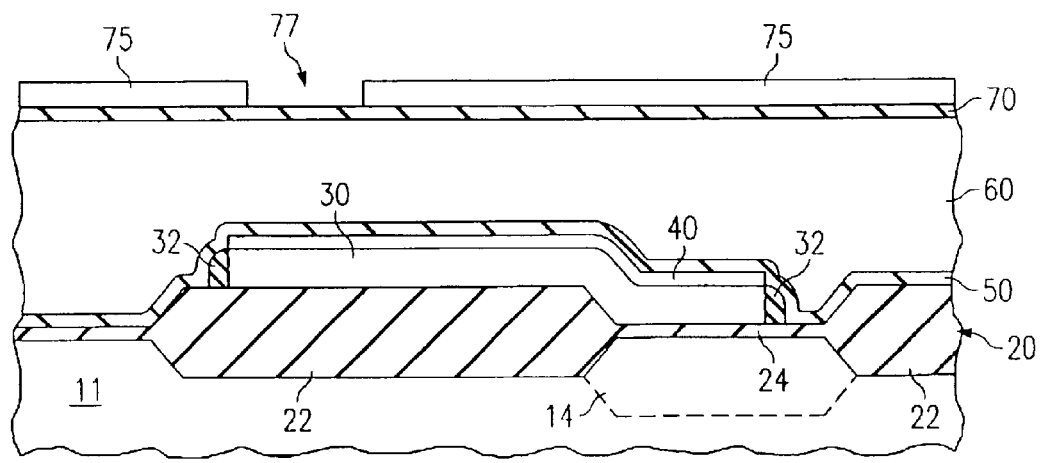
Figure 3J:
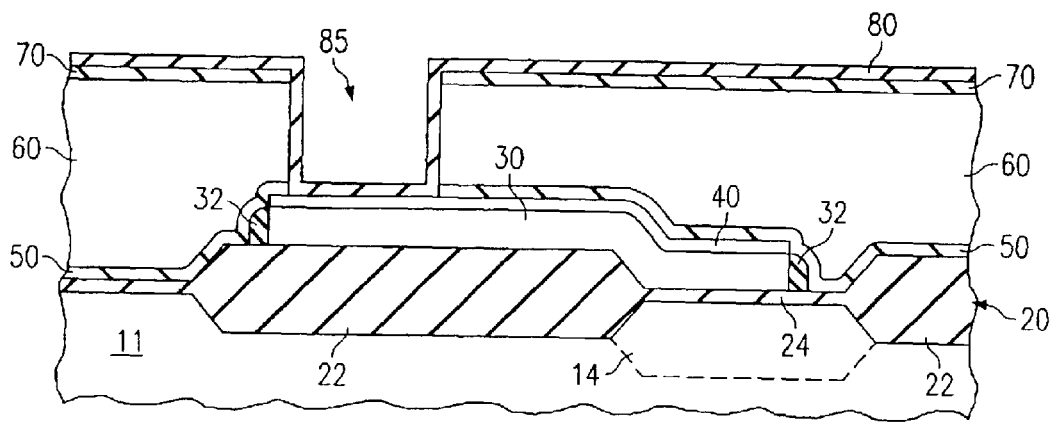
Figure 3K:
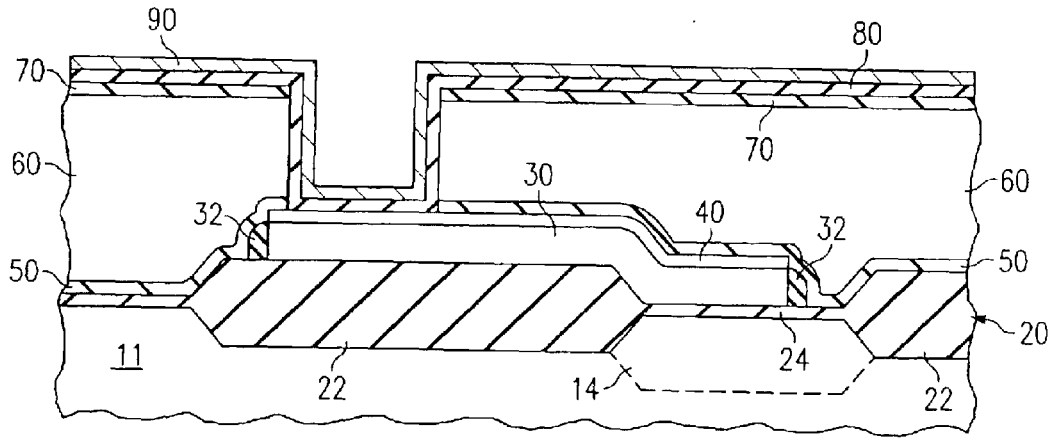
Figure 3L:
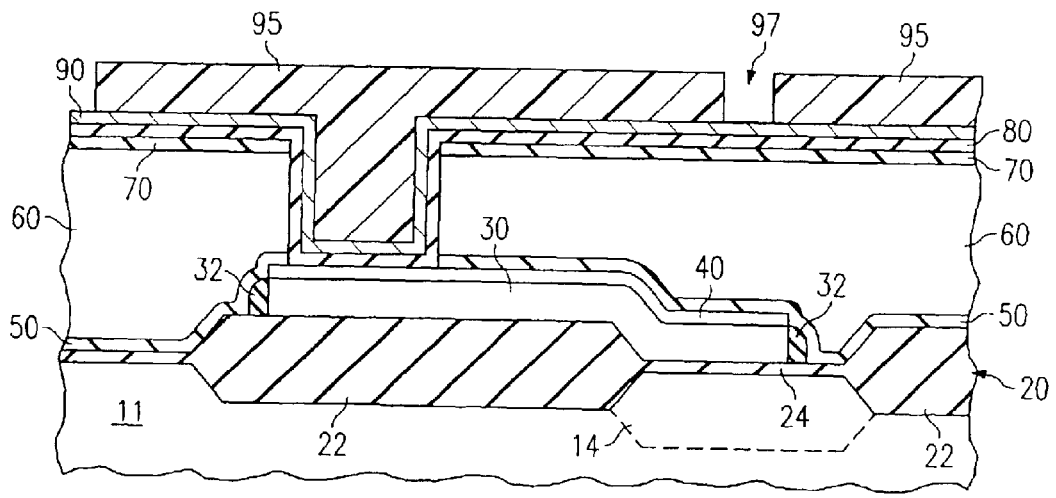
Figure 3M:
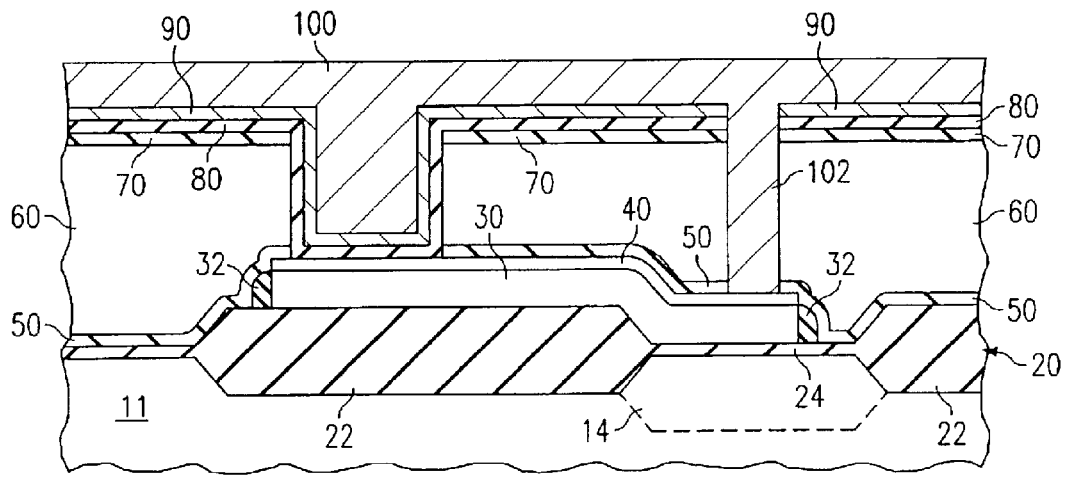
Figure 3N:
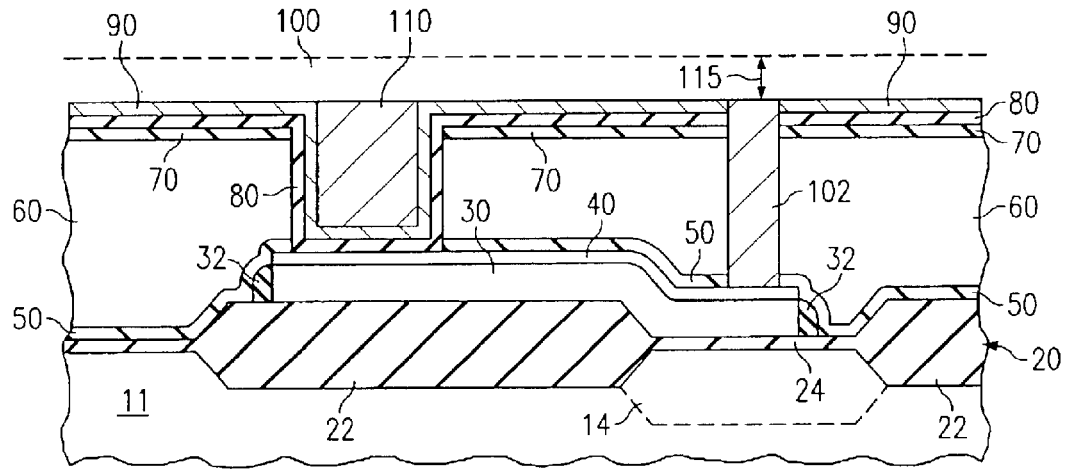
Figure 3O:
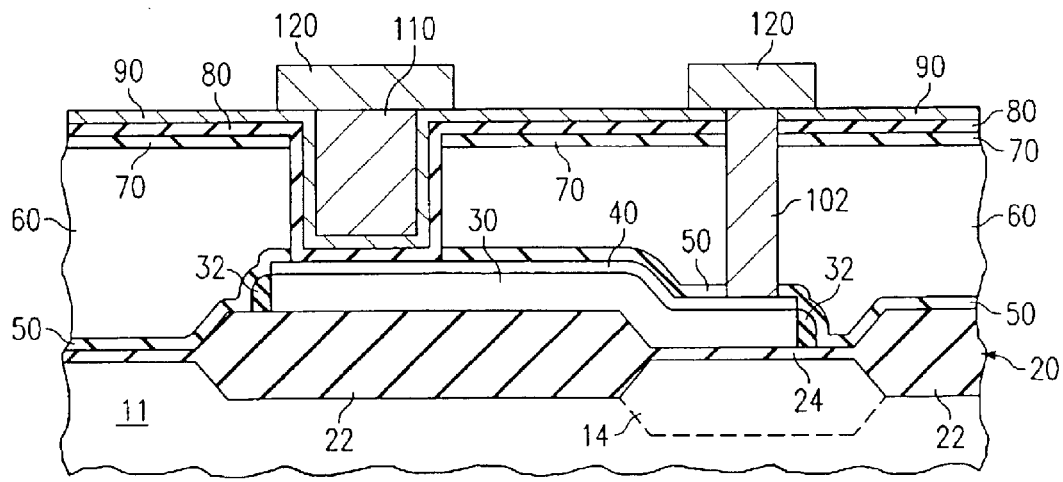

FIGS. 3A through 3O are cross-sectional views illustrating one embodiment of a method of forming semiconductor device 10. Any other suitable semiconductor device may use the method illustrated by FIGS. 3A–3O to form a semiconductor device 10 without departing from the scope of this disclosure. Referring now to FIG. 3A, semiconductor device 10 includes substrate 11 with Pwell region 12.

Referring to FIG. 3B, an oxide layer 20 is disposed outwardly from the substrate 11. In this embodiment, the oxide layer includes gate oxide 22 and field oxide 24. Oxide layer 20 may be formed by any of a variety of techniques known to those skilled in the art including thermal oxidation, CVD (chemical vapor deposition), RTO (Rapid Thermal Oxidation), RPO (Remote Plasma Oxidation), and RT-CVD (Rapid Thermal CVD). In one embodiment, gate oxide layer 22 is formed from a single oxide material and is approximately seventy-five to one hundred twenty Angstroms thick. The field oxide layer 22 may be formed by thermal oxidation of silicon to the final field oxide thickness five thousand to seven thousand Angstroms. While desirable results may be obtained with this thickness range, the invention is not limited to any particular thickness.

Referring to FIG. 3C, a polysilicon layer 30 is disposed outwardly from the oxide layer 20. It will be understood that polysilicon layer 30 may be formed by any technique, such as chemical vapor deposition (CVD), and may comprise any polysilicon or another conductive material. In FIG. 3D, polysilicon layer 30 is etched to form a floating gate structure. Various layers (not shown) are etched to form spacers 32. The various layers may include a nitride layer, an oxide layer, or any other appropriate material. The layers are etched until the outer surface of the floating gate and the outer surface of substrate 10, where polysilicon layer 30 is not present, are exposed leaving spacers 32 disposed along the sidewalls of the gate structure. Any etching technique or etchant may be used for the etching step.

Referring to FIG. 3E, a silicide layer 40 is disposed outwardly from the polysilicon layer 30. It will be understood that silicide layer 40 may be formed by any of a variety of techniques known to those skilled in the art including sputtering, CVD (Chemical Vapor Deposition), and RT-CVD (Rapid Thermal CVD), RTA (Rapid Thermal Anneal), and furnace anneal. Further, it will be understood that silicide layer 40 may not be present without departing from the scope of the present disclosure.

Referring to FIG. 3F, first TEOS layer 50 is disposed outwardly from the silicide layer 40. In this embodiment, the first TEOS layer 50 is approximately five hundred Angstroms thick. While desirable results may be obtained with this thickness range, the invention is not limited to any particular thickness unless expressly included in the claims. First TEOS layer 50 may comprise a plurality of layers without departing from the scope of the present invention. First TEOS layer 50 may be formed by any of a variety of techniques known to those skilled in the art, including CVD (Chemical Vapor Deposition), APCVD (Atmospheric Pressure Chemical Vapor Deposition), RTA (Rapid Thermal Anneal), RTO (Rapid Thermal Oxidation), RPO (Remote Plasma Oxidation), RT-CVD (Rapid Thermal CVD), and thermal oxidation.

Referring to FIG. 3G, PSG layer 60 is disposed outwardly from the first TEOS layer 50. In this embodiment, the PSG layer 60 is approximately fifteen thousand Angstroms thick. While desirable results may be obtained with this thickness range, the invention is not limited to any particular thickness unless expressly included in the claims. The PSG layer 60 may be formed by CVD (Chemical Vapor Deposition), PVD (Physical Vapor Deposition) and PECVD/PEPVD (Plasma Enhanced CVD/Plasma Enhanced PVD), in eventual combination with densification process. The PSG layer 60 is subjected to CMP (Chemical-Mechanical Polishing) until PSG layer 60 is planarized at thickness reduced by distance 62. In one embodiment, the resulting thickness of the PSG layer 60 is between ten and twelve thousand Angstroms over substrate 10.

Referring to FIG. 3H, second TEOS layer 70 is disposed outwardly from the PSG layer 60. In this embodiment, the second TEOS layer 70 is approximately one thousand Angstroms thick. While desirable results may be obtained with this thickness range, the invention is not limited to any particular thickness unless expressly included in the claims. Second TEOS layer 70 may comprise a plurality of layers without departing from the scope of the present invention. Second TEOS layer 70 may be formed by any of a variety of techniques known to those skilled in the art, including CVD (Chemical Vapor Deposition), APCVD (Atmospheric Pressure Chemical Vapor Deposition), RTA (Rapid Thermal Anneal), RTO (Rapid Thermal Oxidation), RPO (Remote Plasma Oxidation), RT-CVD (Rapid Thermal CVD), and thermal oxidation.

Referring to FIG. 3I, a first masking layer 75 may be formed outwardly from the second TEOS layer 70. The first masking layer 75 may comprise photoresist material. In this embodiment, opening 77 may be formed in first masking layer 75 in order to form a capacitor channel 85 (shown in FIG. 3J) in PSG layer 60 and second TEOS layer 70. Opening 77 may be intended to be aligned with the floating gate structure formed by polysilicon layer 30. It will be understood that the first masking layer 75 may comprise other suitable materials and/or be otherwise suitably formed within the scope of the present invention.

Referring to FIG. 3J, a dielectric layer 80 is disposed in capacitor channel 85. Dielectric layer 80 may be formed from any one of a variety of dielectric materials, including oxide or oxide-nitride-oxide (ONO). In this embodiment, the dielectric layer 80 is approximately five hundred Angstroms thick. While desirable results may be obtained with this thickness range, the invention is not limited to any particular thickness unless expressly included in the claims. Dielectric layer 80 may comprise a plurality of layers without departing from the scope of the present invention. Dielectric layer 80 may be formed by any of a variety of techniques known to those skilled in the art, including LPCVD (Low Pressure Chemical Vapor Deposition), CVD (Chemical Vapor Deposition), RTA (Rapid Thermal Anneal), RTO (Rapid Thermal Oxidation), RPO (Remote Plasma Oxidation), RT-CVD (Rapid Thermal CVD), and thermal oxidation.

Referring to FIG. 3K, a titanium-nitride layer 90 is formed outwardly from dielectric layer 80. In this embodiment, the titanium-nitride layer 90 is approximately two hundred Angstroms thick. While desirable results may be obtained with this thickness range, the invention is not limited to any particular thickness unless expressly included in the claims. In this embodiment, titanium-nitride layer 90 may be formed by placing semiconductor device 10 on a heated (approximately 400° C. to 450° C.) chuck for several seconds so that moisture is removed from the surface of semiconductor device 10. Next, titanium-nitride is sputtered over the dielectric layer 80. Further, it will be understood that titanium-nitride layer 90 may not be present without departing from the scope of the present invention.

Referring to FIG. 3L, a second masking layer 95 may be formed outwardly from the second TEOS layer 70. The second masking layer 95 may comprise photoresist material. In this embodiment, PSG layer 60 and second TEOS layer 70 are etched until second masking layer 95 is removed and at least one opening 97 is formed in order to form at least one contact channel 102 (shown in FIG. 3M). Any etching technique with etchants may be used for the etching step. It will be understood that the second masking layer 95 may comprise other suitable materials and/or be otherwise suitably formed within the scope of the present invention.

Referring to FIG. 3M, a tungsten layer 100 is formed outwardly from the second TEOS layer 70 and the titanium-nitride layer 90. In this embodiment, the tungsten layer 100 may be over twelve thousand Angstroms thick in appropriate regions. While desirable results may be obtained with this thickness, the invention is not limited to any particular thickness unless expressly included in the claims. In this embodiment, tungsten layer 100 may be formed by placing semiconductor device 10 on a heated (approximately 400° C. to 450° C.) chuck for several seconds so that moisture is removed from the surface of semiconductor device 10. Next, tungsten is sputtered over the semiconductor device 10.

Referring to FIG. 3N, the tungsten layer 100 is subjected to CMP (Chemical-Mechanical Polishing) until tungsten layer 100 is planarized to a thickness reduced by distance 115. Distance 115 may be the thickness of the portion of the tungsten layer 100 that is disposed outwardly from the second TEOS layer 70. In this embodiment, the planarization reduces the thickness of the tungsten layer 100 by distance 115 and results in three substantially isolated tungsten plugs 110 filling capacitor channel 85 and contact channels 102. The tungsten plug filling capacitor channel 85 may be six thousand Angstroms thick and the tungsten plugs filling contact channels 102 may be ten to twelve thousand Angstroms thick.

Referring to FIG. 3O, a metallized layer 120 is formed outwardly from tungsten plugs 110. The metallized layer 120 may be formed by CVD (Chemical Vapor Deposition), PVD (Physical Vapor Deposition), PECVD/PEPVD (Plasma Enhanced CVD/Plasma Enhanced PVD), and sputtering, in eventual combination with annealing processes. The metallized layer 120 is etched to form at least one contact disposed substantially above capacitor channel 85 and/or contact channels 102.

Although the present invention has been described in detail, it should be understood that various changes, substitutions and alterations can be made hereto without departing from the sphere and scope of the invention as defined by the appended claims.

To aid the Patent Office, and any readers of any patent issued on this application in interpreting the claims appended hereto, applicants wish to note that they do not intend any of the appended claims to invoke 35 U.S.C. § 112, ¶ 6 as it exists on the date of filing hereof unless "means for" or "step for" are used in the particular claim.

What is claimed is:

1. A method for manufacturing a semiconductor device, comprising:

forming an oxide layer adjacent a substrate;

forming a polysilicon layer disposed outwardly from the oxide layer, wherein the polysilicon layer forms a floating gate;

forming a PSG layer disposed outwardly from the polysilicon layer;

planarizing the PSG layer;

forming a capacitor channel, wherein the capacitor channel is disposed substantially above the floating gate formed from the polysilicon layer;

forming a dielectric layer in the capacitor channel disposed outwardly from the polysilicon layer;

forming a tungsten plug operable to substantially fill the capacitor channel; and forming a first TEOS layer disposed outwardly from the polysilicon layer and disposed inwardly from the PSG layer; and forming a second TEOS layer disposed outwardly from the planarized PSG layer and disposed inwardly from the dielectric layer.

2. The method of claim 1, further comprising forming a silicide layer disposed outwardly from the polysilicon layer and disposed inwardly from the first TEOS layer.

3. The method of claim 1, further comprising forming a titanium-nitride layer disposed outwardly from the dielectric layer and disposed inwardly from the tungsten plug.

4. The method of claim 1, further comprising forming a metallized layer disposed outwardly from the tungsten plug, wherein the metallized layer forms at least one contact.

5. The method of claim 4, wherein forming the metallized layer comprises:

forming a titanium layer;

forming an aluminum-copper layer disposed outwardly from the titanium layer; and forming a second titanium-nitride layer disposed outwardly from the aluminum-copper layer.

6. The method of claim 4, wherein forming the metallized layer comprises:

forming a titanium layer;

forming a second titanium-nitride layer disposed outwardly from the titanium layer;

forming an aluminum-copper disposed outwardly from the second titanium-nitride layer; and forming a third titanium-nitride layer disposed outwardly from the aluminum-cooper layer.

7. The method of claim 1, wherein forming the tungsten plug comprises:

forming a tungsten layer disposed outwardly from the dielectric layer and the second TEOS layer; and removing the portion of the tungsten layer disposed outwardly from the second TEOS layer.

8. The method of claim 7, wherein removing the portion of the tungsten layer disposed outwardly from the second TEOS layer comprises performing chemical-mechanical polishing on the tungsten layer.

9. The method of claim 1, wherein the tungsten plug comprises a first tungsten plug and the method further comprises:

pattern etching to form a contact channel; and forming a second tungsten plug operable to substantially fill the contact channel.

10. A method for manufacturing a semiconductor device, comprising:

forming an oxide layer over a substrate;

forming a polysilicon layer disposed outwardly from the oxide layer, wherein the polysilicon layer forms a floating gate;

forming a silicide layer disposed outwardly from the polysilicon layer;

forming a first TEOS layer disposed outwardly from the suicide layer;

forming a PSG layer disposed outwardly from the first TEOS layer;

planarizing the PSG layer;

forming a second TEOS layer disposed outwardly from the planarized PSG layer;

pattern etching to form a capacitor channel, wherein the capacitor channel is disposed substantially above the floating gate formed from the polysilicon layer;

forming a dielectric layer in the capacitor channel disposed outwardly from the polysilicon layer;

forming a titanium-nitride layer disposed outwardly from the dielectric layer;

forming a tungsten plug operable to substantially fill the capacitor channel; and forming a metallized layer disposed outwardly from the tungsten plug, wherein the metallized layer forms at least one contact.

* * * * *